(12) United States Patent
Li et al.

(10) Patent No.: US 10,957,946 B2
(45) Date of Patent: Mar. 23, 2021

(54) CAPACITY DEGRADATION ANALYSIS FOR BATTERIES

(71) Applicant: International Business Machines Corporation, Armonk, NY (US)

(72) Inventors: Xing Li, Shenzhen (CN); Robert B Schlak, Hyde Park, NY (US); Richard John Fishbune, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 16/539,201

(22) Filed: Aug. 13, 2019

(65) Prior Publication Data

US 2021/0050631 A1 Feb. 18, 2021

(51) Int. Cl.
*H01M 10/44* (2006.01)
*G01R 31/3835* (2019.01)
(Continued)

(52) U.S. Cl.
CPC ...... *H01M 10/446* (2013.01); *G01R 31/3835* (2019.01); *H01M 10/0525* (2013.01);
(Continued)

(58) Field of Classification Search
CPC ........... H01M 10/446; H01M 10/0525; H01M 10/4257; H01M 2010/4278;
(Continued)

(56) References Cited

U.S. PATENT DOCUMENTS 8,102,152 B2   1/2012  Ugaji et al.
8,305,085 B2  11/2012  Kawabuchi et al.
(Continued)

FOREIGN PATENT DOCUMENTS

CN   103336248 A   10/2013
CN   105765396 A    7/2016
(Continued)

OTHER PUBLICATIONS

Xu et al., "Modeling of Lithium-Ion Battery Degradation for Cell Life Assessment", IEEE Power & Energy Society General Meeting, Jul. 16-20, 2017, Abstract Only, 1 page.
(Continued)

*Primary Examiner* — M Baye Diao
(74) *Attorney, Agent, or Firm* — Stosch Sabo

(57) ABSTRACT

Described herein are techniques for battery management. The techniques include a method comprising initializing a battery management system (BMS) associated with a battery and calculating a degraded battery capacity by charging the battery from a first voltage threshold to a test voltage threshold, discharging the battery from the test voltage threshold to the first voltage threshold, collecting measurements of discharge capacity at predetermined voltage measurement points while discharging the battery from the test voltage threshold to the first voltage threshold, generating a polynomial fit function for discharge capacity as a function of voltage for the battery based on the measuring, and estimating the degraded battery capacity. The method further includes charging the battery based on the degraded battery capacity, the charging resulting in the battery maintaining an updated voltage threshold.

20 Claims, 11 Drawing Sheets

(51) Int. Cl.
  *H01M 10/0525*   (2010.01)
  *H02J 7/00*   (2006.01)
  *H01M 10/42*   (2006.01)

(52) U.S. Cl.
  CPC ...... *H02J 7/0086* (2013.01); *H02J 7/007184* (2020.01); *H01M 10/4257* (2013.01); *H01M 2010/4271* (2013.01); *H01M 2010/4278* (2013.01)

(58) Field of Classification Search
  CPC ....... H01M 2010/4271; H02J 7/007184; H02J 7/0086; H02J 7/007182; G01R 31/3835
  USPC .......................................................... 320/134
  See application file for complete search history.

(56) References Cited

U.S. PATENT DOCUMENTS

| | | | |
|---|---|---|---|
| 8,355,965 | B2 | 1/2013 | Yamada |
| 8,718,988 | B2 * | 5/2014 | Bohlen ................ G01R 31/367 703/4 |
| 10,557,890 | B2 * | 2/2020 | Li ...................... G01R 31/3842 |
| 2001/0022518 | A1 | 9/2001 | Asakura et al. |
| 2010/0036626 | A1 | 2/2010 | Kang et al. |
| 2012/0029851 | A1 | 2/2012 | Nakayama et al. |
| 2013/0076363 | A1 | 3/2013 | Takahashi et al. |
| 2017/0115355 | A1 * | 4/2017 | Willard ................ G01R 31/392 |

FOREIGN PATENT DOCUMENTS

| | | | | |
|---|---|---|---|---|
| JP | 6350875 | B2 * | 7/2018 | ........... G01R 31/367 |
| KR | 20150029204 | A * | 3/2015 | ........... G01R 31/392 |
| WO | 2011135609 | A1 | 11/2011 | |
| WO | 2012073997 | A1 | 6/2012 | |

OTHER PUBLICATIONS

Zhang et al., "Online Capacity Estimation of Lithium-Ion Batteries Based on Novel Feature Extraction and Adaptive Multi-Kernel Relevance Vector Machine", MDPI, Published: Nov. 4, 2015, 19 pages.

Anonymous, "System and Method to Estimate Remaining Battery Life Using Similar Battery Usage Pattern Matching Algorithm", An IP.com Prior Art Database Technical Disclosure, IP.com No. IPCOM000238313D, IP.com Electronic Publication Date: Aug. 18, 2014, 8 pages.

IBM, "Application Specific Battery Storage Exit Capacity Calculator", An IP.com Prior Art Database Technical Disclosure, IP.com No. IPCOM000184809D, IP.com Electronic Publication Date: Jun. 30, 2009, 8 pages.

Anonymous, "Pulse Method to Reduce Irreversible Capacity Fade Implantable Secondary Batteries", An IP.com Prior Art Database Technical Disclosure, IP.com No. IPCOM000020255D, IP.com Electronic Publication Date: Nov. 6, 2003, 13 pages.

Mell et al., "The NIST Definition of Cloud Computing", Recommendations of the National Institute of Standards and Technology, Sep. 2011, 7 pages.

* cited by examiner

CAPACITY DEGRADATION ANALYSIS FOR BATTERIES

BACKGROUND

The present disclosure relates to batteries, and, more specifically, to estimating capacity degradation in batteries.

Batteries are devices that convert chemical energy into electrical energy. Batteries can be made up of numerous modules and/or cells. Cells are traditionally the smallest, discrete form a battery can take and can have a range of voltages (e.g., one to five volts). Cells can be combined in series or parallel to form a module. Numerous modules can be assembled to form a battery.

SUMMARY

Aspects of the present disclosure are directed toward a computer-implemented method comprising initializing a battery management system associated with a battery, the battery management system storing a discharge capacity reference table indicating discharged capacities at predetermined voltages and predetermined loads for the battery in a new state. The method further comprises calculating a degraded battery capacity by charging the battery from a first voltage threshold to a test voltage threshold, discharging the battery from the test voltage threshold to the first voltage threshold, measuring discharge capacity at predetermined voltage measurement points while discharging the battery from the test voltage threshold to the first voltage threshold, generating a polynomial fit function for discharge capacity as a function of voltage for the battery based on the measuring, and estimating the degraded battery capacity based on a difference between a reference discharge capacity for the first voltage threshold according to the discharge capacity reference table and a predicted discharge capacity based on inputting the first voltage threshold to the polynomial fit function. The method further comprises charging the battery based on the degraded battery capacity to cause the battery to maintain an updated voltage threshold.

Additional aspects of the present disclosure are directed to systems and computer program products configured to perform the method described above. The present summary is not intended to illustrate each aspect of, every implementation of, and/or every embodiment of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
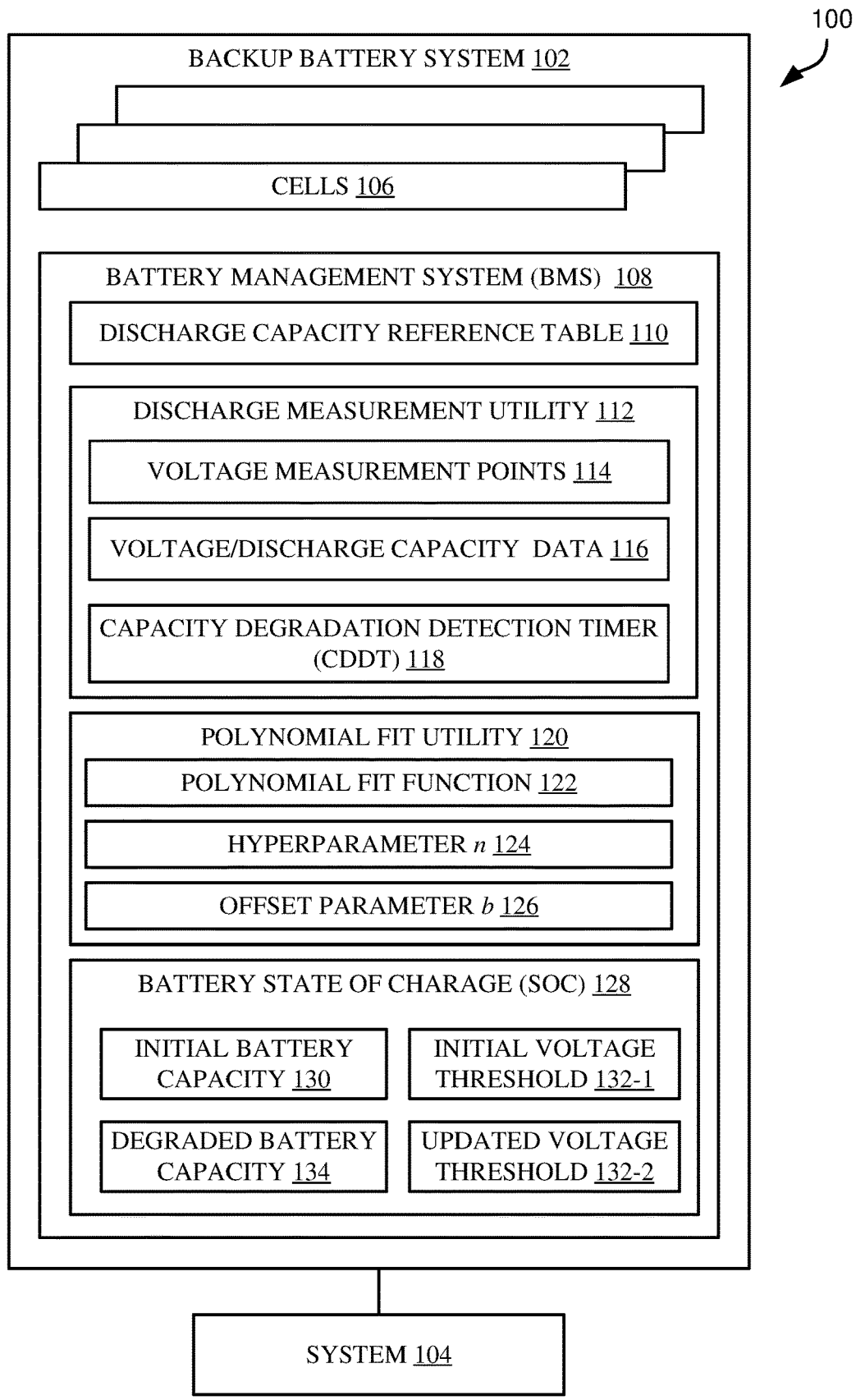
FIG. 1 illustrates a block diagram of an example backup battery system, in accordance with some embodiments of the present disclosure.

While the present disclosure is amenable to various modifications and alternative forms, specifics thereof have been shown by way of example in the drawings and will be described in detail. It should be understood, however, that the intention is not to limit the present disclosure to the particular embodiments described. On the contrary, the intention is to cover all modifications, equivalents, and alternatives falling within the spirit and scope of the present disclosure.

DETAILED DESCRIPTION

Aspects of the present disclosure are directed toward batteries, and, more specifically, to estimating capacity degradation in batteries. While not limited to such applications, embodiments of the present disclosure may be better understood in light of the aforementioned context.

As used herein, the term "cell" can generally refer to a single battery (e.g., a single lithium-ion battery). The term "battery" can refer to a battery pack formed by a certain number of lithium-ion cells in a parallel or series connection. The term "system" can refer to a target device relying upon a lithium-ion battery for redundant power in the event of loss of mains power (e.g., loss of corded power).

Batteries such as lithium-ion batteries (LIB) are used in a variety of areas including consumer electronics, electrical vehicles, and data centers. Batteries are typically used for either cycling applications or standby applications. In a standby application, the battery is often stored for relatively longer periods of time and occasionally used for relatively shorter periods of time. As a result, it can be beneficial to lengthen battery service life for batteries in standby applications. The service life of a battery is mainly impacted by two factors—storage temperature and battery State of Charge (SoC). Battery performance degrades over time as a result of degrading capacity and increasing internal resistance. During storage, increased temperature or higher SoC results in faster degradation of capacity and faster increases in internal resistance. In an effort to improve service life of batteries in standby applications, batteries in standby applications can be placed in an environment where the temperature is appropriate (e.g., room temperature) with a partial SoC (e.g., sufficient SoC to provide adequate power in a standby application). An appropriate temperature and a partial SoC decrease the rate of battery capacity degradation.

In some standby applications, a high capacity battery is used together with a partial SoC as one technique for lengthening the service life of the battery. Such a strategy includes occasionally charging the battery to a higher SoC to compensate for decreased capacity that occurs as a result of time.

One method for defining a partial SoC is to set the partial SoC at or above a required system capacity and with an additional design margin. However, as previously discussed, the actual capacity of the battery is continuously dropping because of self-discharge, drain from peripheral circuits in a battery pack, and/or time-based degradation while being stored. Regular charging can be used to compensate for the self-discharge and peripheral circuit drain. In addition, the battery can be charged regularly to compensate for the degraded capacity and maintain an appropriate partial SoC to meet system requirements. As a result, accurately calculating degraded battery capacity can lead to maintaining the minimum required SoC which is useful for improving service life and reliability. In other words, a rough, or inaccurate estimation of degraded battery capacity can lead to an unnecessarily high partial SoC in order to compensate for errors in the rough or inaccurate estimation of degraded battery capacity. In contrast, an accurate estimation of degraded battery capacity can lead to an appropriate partial SoC. Since an appropriate partial SoC is lower than the unnecessarily high partial SoC, calculating accurate degraded battery capacities leads to improvements in service life for batteries (e.g., in standby applications).

Traditionally, estimating degraded battery capacity is done by off-line discharging of the battery. The disadvantages of this traditional method are (1) loss of backup capability during battery capacity testing in a standalone application; and (2) loss of redundancy during battery capacity testing in a redundant (e.g., standby) application. Aspects of the present disclosure are directed to overcoming the aforementioned disadvantages by introducing a technique for accurately calculating degraded battery capacity while the battery remains functional.

In some embodiments, the present disclosure performs a method including initializing a battery management system associated with a battery, the battery management system storing a discharge capacity reference table indicating discharge capacities at predetermined voltages and predetermined loads for the battery in a new state. The method further comprises calculating a degraded battery capacity by: (1) charging the battery from a first voltage threshold to a test voltage threshold, (2) discharging the battery from the test voltage threshold to the first voltage threshold, (3) measuring discharge capacity at predetermined voltage measurement points while discharging the battery from the test voltage threshold to the first voltage threshold, (4) generating a polynomial fit function for discharge capacity as a function of voltage for the battery based on the measuring, and (5) estimating a degraded capacity based on a difference between a reference discharge capacity for the first voltage threshold according to the discharge capacity reference table and a predicted discharge capacity based on inputting the first voltage threshold to the polynomial fit function. The method further comprises charging the battery based on the degraded battery capacity to cause the battery to maintain an updated voltage threshold.

The method described above includes numerous improvements over the state of the art. First, the updated voltage threshold satisfies system requirements of the battery. Second, the updated voltage threshold improves the service life of the battery as a result of the accurate calculation of the degraded battery capacity. Third, throughout the techniques described above, the battery never experiences downtime (e.g., the battery never falls below the first voltage threshold). Since the battery never goes offline, the battery can provide standby power (or continuous power) to a system application any time during the method described above. Fourth, the techniques described above are agnostic with respect to the reason for the degraded battery capacity. Thus, aspects of the present disclosure can be utilized in any environment where battery degradation occurs, regardless of the reason for that degradation (e.g., aging, temperature, cycling, parasitic drain, internal resistance, etc.). The advantages discussed above and hereafter are example advantages, and embodiments of the present disclosure can exist that realize all, some, none, or different advantages than the example advantages discussed herein.

Referring now to FIG. 1, illustrated is a diagram of an example system with backup functionality 100 in accordance with some embodiments of the present disclosure. System with backup functionality 100 can include a backup battery system 102 communicatively coupled to a system 104. System 104 can be any configuration of hardware and software that utilizes electricity to function and can benefit from switching to a backup battery system 102 if mains power is lost. For example, system 104 can be a computer, a laptop, a server, a router, a storage device, a vehicle, a home appliance (e.g., refrigerator, alarm system, sump pump, lighting, heating, ventilation, and cooling (HVAC) system, furnace, air conditioner, boiler, water heater, and the like), and/or any other configuration of hardware and software primarily relying on mains power and configured to switch to power supplied by backup battery system 102 in response to loss of mains power.

Although backup battery system 102 is shown as an example in FIG. 1, aspects of the present disclosure are also relevant to situations where a battery is providing continuous power to a system 104. In those cases, system 104 can also be any battery-powered device, such as, for example, laptops, tablets, smartphones, vehicles, watercraft, drones, Internet of Things (IoT) sensors, and the like.

Backup battery system 102 can include one or many cells 106. In some embodiments, cells 106 are arranged in modules (not shown). In some embodiments, different combinations of cells 106 are arranged in series and/or in parallel.

Backup battery system 102 further includes battery management system (BMS) 108. BMS 108 includes a discharge capacity reference table 110. Discharge capacity reference table 110 can indicate discharge capacities (denoted as $c_{dis\_ij}$) for respective combinations of cell voltage values (between a minimum cell voltage value, $v_{min}$, and a maximum cell voltage value, $v_{max}$) at respective test load values (between a minimum test load value, $P_{min}$, and a maximum test load value, $P_{max}$). An example discharge capacity reference table 110 is shown below in Table 1:

TABLE 1

Discharge capacity for Respective Combinations of Fresh Cell Voltage and Discharge Load

| OCV\Discharge Load | $P_{min}$ | $P_2$ | $\ldots P_j$ | $\ldots$ | $P_{max}$ |
|---|---|---|---|---|---|
| $v_{min}$ | $c_{dis\_11}$ | $c_{dis\_12}$ | $\ldots c_{dis\_1j}$ | $\ldots$ | $\ldots$ |
| $v_2$ | $c_{dis\_21}$ | $c_{dis\_22}$ | $\ldots c_{dis\_2j}$ | $\ldots$ | $\ldots$ |
| $\ldots$ | $\ldots$ | $\ldots$ | $\ldots\ldots$ | $\ldots$ | $\ldots$ |
| $v_i$ | $c_{dis\_i1}$ | $c_{dis\_i2}$ | $\ldots c_{dis\_ij}$ | $\ldots$ | $\ldots$ |
| $\ldots$ | $\ldots$ | $\ldots$ | $\ldots\ldots$ | $\ldots$ | $\ldots$ |
| $v_{max}$ | $\ldots$ | $\ldots$ | $\ldots\ldots$ | $\ldots$ | $\ldots$ |

Discharge capacity reference table 110 can be developed from experimental testing or provided by a manufacturer as part of a specification and/or documentation package of a particular type of cell or battery. As shown in Table 1, any number of voltages (v) and test loads (P) can be included in the discharge capacity reference table 110. In the example shown in Table 1, the voltages are open-circuit voltages (OCV).

BMS 108 further includes discharge measurement utility 112 which includes software instructions executable on hardware for causing the BMS 108 to charge cells 106 from a first threshold voltage to a test threshold voltage, and then measure discharge capacity at one or more voltage measurement points 114 between the test threshold voltage and the first threshold voltage while discharging the cells 106 from the test threshold voltage to the first threshold voltage using a first load (e.g., $P_1$) to generate voltage/discharge capacity data 116. Voltage/discharge capacity data 116 can include at least a measured discharge capacity for each of the voltage measurement points 114. In some embodiments, voltage/discharge capacity data 116 is stored in the format ($C_k$, $V_k$) where C is discharge capacity, V is voltage, and k refers to any one of many voltage measurement points 114.

Discharge measurement utility 112 can further include a capacity degradation detection timer (CDDT) 118 for controlling intervals at which a discharge measurement utility 112 is implemented to generate voltage/discharge capacity data 116 for predefined voltage measurement points 114. CDDT 118 can be triggered by time (e.g., occurs each week, each month, each quarter, etc.), triggered by usage (e.g., occurs after the backup battery system 102 is used to supply backup power to system 104), or manually triggered (e.g., initiated by a user interacting with backup battery system 102 via a user interface). In some embodiments, the CDDT 118 triggers implementation of discharge measurement utility 112 at a time interval between and including one week to twelve weeks.

BMS 108 further includes polynomial fit utility 120 for generating a polynomial fit function 122 to approximate the voltage/discharge capacity data 116 collected by discharge measurement utility 112. Polynomial fit function 122 can be a polynomial function with an order according to a predefined hyperparameter n 124. Hyperparameter n 124 can be selected to balance the need for a good fit (e.g., a coefficient of determination value (R-squared value, or $R^2$ value) at or above a threshold such as 0.90, 0.98, 0.99, etc.) with the computational cost associated with calculating higher-order polynomial fit functions. In some embodiments, the hyperparameter n 124 is a whole number in the inclusive range of two to four. However, this is but one example of the range of hyperparameter n 124, and in other embodiments, hyperparameter n 124 can be any other number. In some embodiments, the polynomial fit function 122 realizes an $R^2$ value above a fit threshold, where the fit threshold is between an inclusive range of 0.90 and 0.99.

Further, in some embodiments, the polynomial fit function 122 can be associated with an offset parameter b 126, where the offset parameter b 126 can be used to shift the polynomial fit function 122 to below the voltage/discharge capacity data 116. Advantageously, utilizing an offset parameter b 126 to shift the polynomial fit function 122 to below the voltage/discharge capacity data 116 can be used to ensure that the shifted polynomial fit function 122 is a conservative estimate. Thus, by reducing the risk of overestimating the discharge capacity for a given voltage (or vice versa), aspects of the present disclosure can ensure at least an appropriate partial SoC is maintained according to the requirements of system 104.

BMS 108 is configured to modify the battery SoC 128 as needed to compensate for deteriorations in battery capacity as a result of aging, cycling, or other factors. Battery SoC 128 includes an initial voltage threshold 132-1, where the initial voltage threshold 132-1 is configured to maintain a SoC 128 for an initial battery capacity 130 (e.g., fresh battery capacity, current battery capacity, etc.) according to the requirements of system 104. Battery SoC 128 can further include a calculation to determine degraded battery capacity 134, where degraded battery capacity 134 can be based on a difference between a reference discharge capacity for the initial voltage threshold 132-1 according to the discharge capacity reference table 110 and a predicted discharge capacity based on inputting the initial voltage threshold 132-1 to the polynomial fit function 122. In some embodiments, the backup battery system 102 charges the cells 106 according to (or by) the degraded battery capacity 134 in order to have the cells maintain an updated voltage threshold 132-2, where the updated voltage threshold 132-2 maintains adequate battery SoC 128 as required by system 104 and in light of the degraded battery capacity 134.

Figure 2:
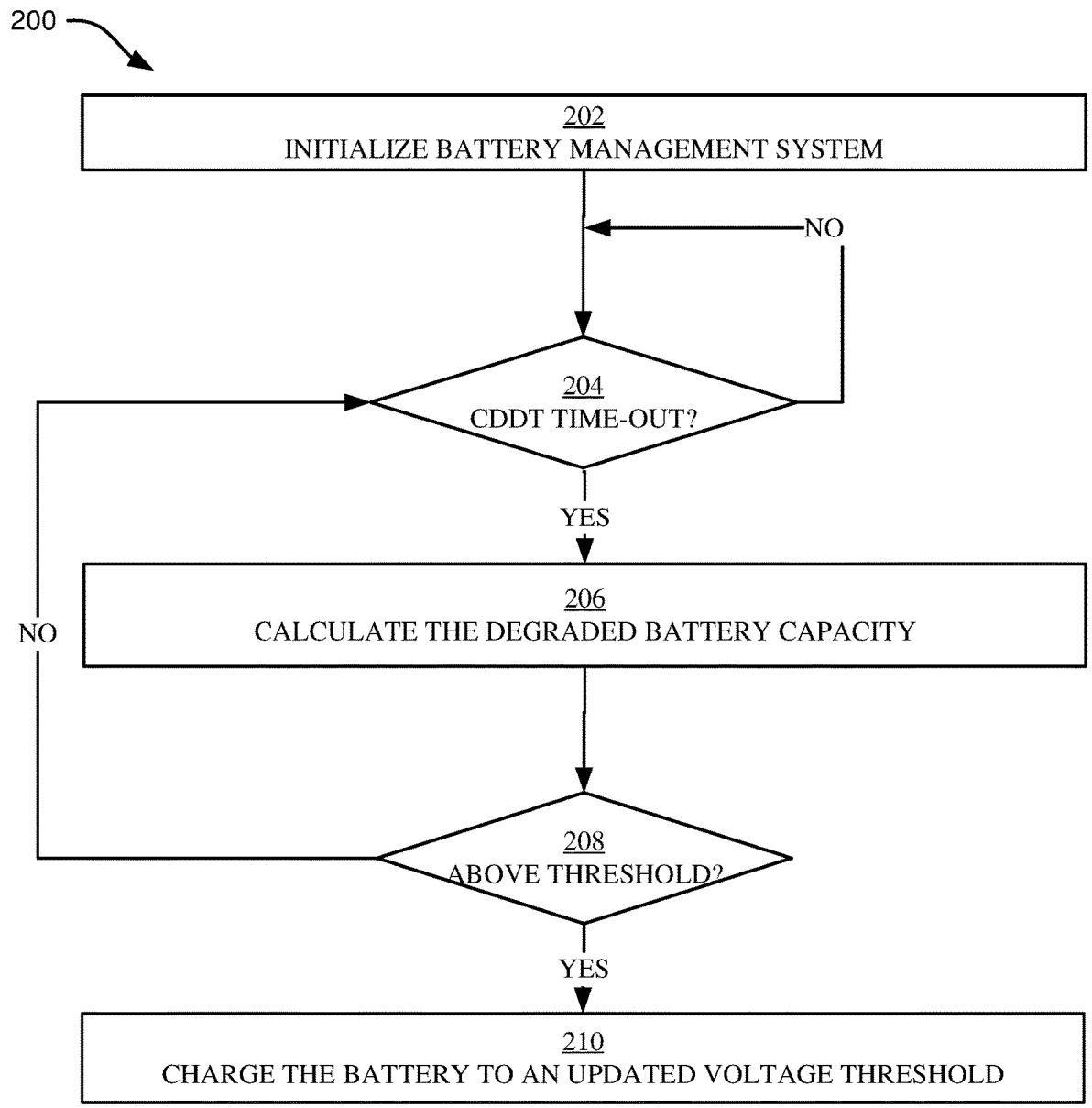
FIG. 2 illustrates a flowchart of an example method for managing battery state of charge (SoC) for a backup battery while it remains online, in accordance with some embodiments of the present disclosure.

Referring now to FIG. 2, illustrated is a flowchart of an example method 200 for charging a backup battery system 102 to an updated voltage threshold 132-2. In some embodiments, the method 200 is implemented by a backup battery system 102, a BMS 108, or a different configuration of hardware and/or software.

Operation 202 includes initializing the BMS 108. Initializing the BMS 108 can include loading a discharge capacity reference table 110 into the BMS 108, loading voltage measurement points 114 into discharge measurement utility 112, loading a hyperparameter n 124 and/or an offset parameter b 126 into the polynomial fit utility 120, and/or inputting battery SoC 128 information into BMS 108. Battery SoC 128 information can include an initial battery capacity 130 together with an initial voltage threshold 132-1. Further, in some embodiments, operation 202 includes initiating, triggering, or starting a CDDT 118. Operation 202 is discussed in more detail hereinafter with respect to FIG. 3.

Operation 204 includes determining if the CDDT 118 has timed out, expired, or otherwise received an indication to evaluate capacity degradation in backup battery system 102. If not (204: NO), then the method 200 returns to operation 204 at respective intervals. If so (204: YES), then the method 200 proceeds to operation 206.

Operation 206 includes calculating the degraded battery capacity 134 based on a difference between a reference discharge capacity for the first voltage threshold according to the discharge capacity reference table 110 and a predicted discharge capacity based on inputting the first voltage threshold to the polynomial fit function 122. Operation 206 is discussed in more detail hereinafter with respect to FIGS. 4A-4B.

Operation 208 includes determining if the degraded battery capacity 134 is above a capacity degradation threshold. If not (208: NO), then the method 200 returns to operation 204 and awaits a next CDDT 118 expiration. If so (208: YES), then the method 200 proceeds to operation 210.

Operation 210 includes charging the cells 106 to an updated voltage threshold 132-2, where the updated voltage threshold 132-2 maintains an adequate battery SoC 128 in light of the degraded battery capacity 134. In some embodiments, operation 210 includes charging the cells 106 based on (or by) the degraded battery capacity 134.

Although not explicitly shown in FIG. 2, if at any point in the method 200 the backup battery system 102 is required to provide power to system 104, then the method 200 (or its sub-methods discussed hereafter with respect to FIGS. 3, 4A, and 4B) can be paused, power provided to the system 104, and, after mains power is restored to system 104, the method 200 (or its sub-methods) can be resumed. Such embodiments can include operations of (1) detecting the system 104 lost mains power, (2) pausing the method 200, (3) directing power from cells 106 to the system 104, (4) detecting mains power is restored to the system 104, (5) stopping delivering power from cells 106 the system 104, and (6) resuming the method 200.

Figure 3:
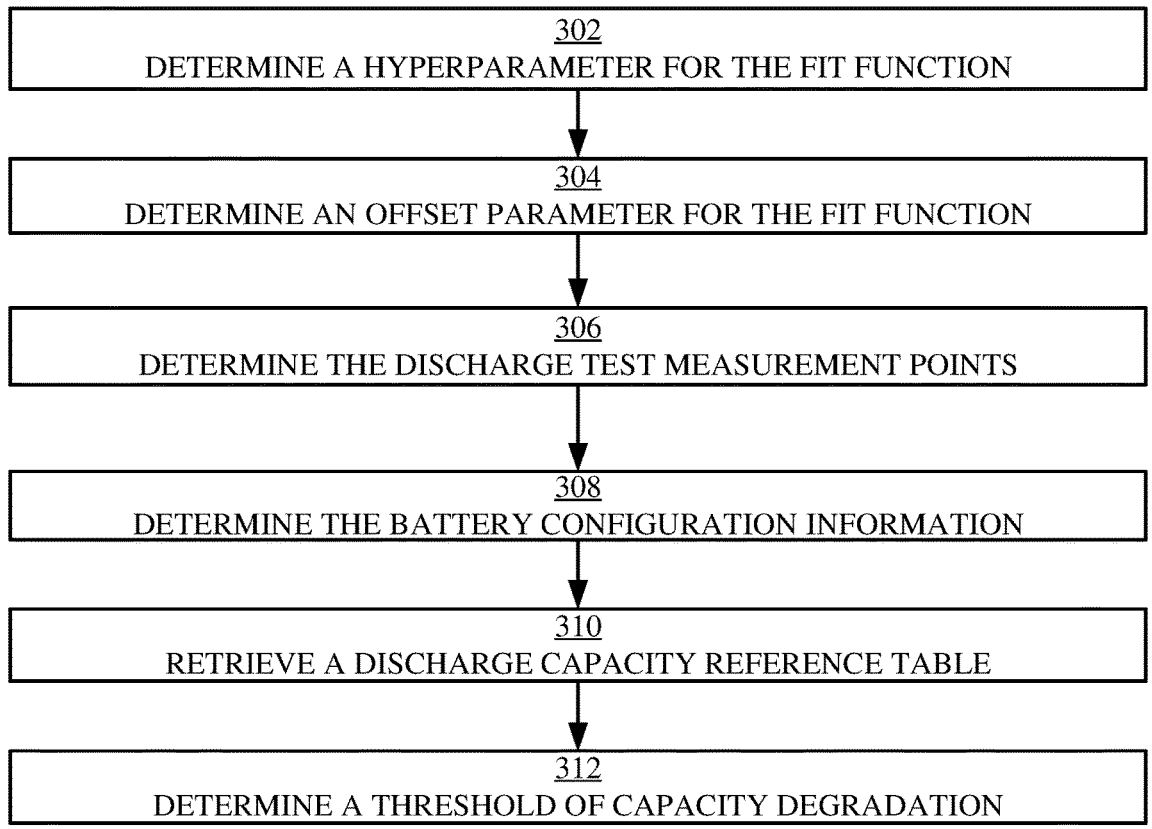
FIG. 3 illustrates a flowchart of an example method for initializing a battery management system, in accordance with some embodiments of the present disclosure.

Referring now to FIG. 3, illustrated is a flowchart of an example method 300 for initializing a BMS 108, in accordance with some embodiments of the present disclosure. In some embodiments, the method 300 is implemented by a backup battery system 102, a BMS 108, or a different configuration of hardware and/or software. In some embodiments, the method 300 is a sub-method of operation 202 of FIG. 2.

Operation 302 includes determining a hyperparameter n 124 to be used as the order of the polynomial fit function 122. A higher hyperparameter n 124 can result in a more accurate polynomial fit function 122 with a higher computational cost. In contrast, a lower hyperparameter n 124 can result in a less accurate polynomial fit function 122 with a lower computational cost. Thus, a hyperparameter n 124 can be selected that achieves an adequate goodness-of-fit with an acceptable computational cost. In some embodiments, operation 302 includes verifying that the selected hyperparameter n 124 results in a polynomial fit function 122 with a coefficient of determination ($R^2$ or R-squared value) at or above a threshold (e.g., above 0.90, 0.98, 0.99, etc.).

Operation 304 includes determining an offset parameter b 126 for the polynomial fit function 122. A lower offset parameter b 126 can result in a higher accuracy of the polynomial fit function 122 relative to the voltage/discharge capacity data 116 and a higher probability of inadvertently underestimating a degraded battery capacity 134. Meanwhile, a higher offset parameter b 126 can result in a lower accuracy of the polynomial fit function 122 relative to the voltage/discharge capacity data 116 with a lower probability of inadvertently underestimating a degraded battery capacity 134. Accordingly, operation 304 includes selecting an offset parameter b 126 that balances an acceptable accuracy with an acceptable probability that the polynomial fit function 122 shifted by the offset parameter b 126 underestimates a predicted discharge capacity with the initial voltage threshold 132-1 as input, thereby overestimating the degraded battery capacity 134 (ensuring the updated voltage threshold 132-2 maintains at least an adequate SoC 128 for powering system 104). In some embodiments, the offset parameter b 126 is in an inclusive range of 0.05 to 0.50. However, this is but one example of the range of offset parameter b 126, and in other embodiments, offset parameter b 126 can be any other number.

Operation 306 includes determining voltage measurement points 114. Determining voltage measurement points 114 can include identifying one or more voltages between an initial voltage threshold 132-1 and a test voltage threshold at which the discharge management utility 112 can measure discharge capacity while discharging cells 106 from the test voltage threshold back to the initial voltage threshold 132-1. Voltage measurement points 114 can include any number of predefined voltages such as less than, more than, or equal to, two, five, ten, twenty, and so on.

Operation 308 includes determining battery configuration information for cells 106. Battery configuration information can relate to number of cells 106 and/or arrangement of cells 106 (e.g., arranged in series, parallel, or a combination of series and parallel arrangements).

Operation 310 includes retrieving a discharge capacity reference table 110 and storing it in BMS 108. Discharge capacity reference table 110 can be based on characteristics of cells 106 such as cell type, cell model number, cell size, cell manufacturer, and so on.

Operation 312 includes determining a threshold of capacity degradation (e.g., $\Psi_0$). Threshold capacity degradation can be used in operation 208 of FIG. 2 to determine whether or not the degraded battery capacity 134 is of a significant enough amount to warrant charging cells 106. In some embodiments, the threshold of capacity degradation can be defined as a percentage of the initial battery capacity 130. In such embodiments, the threshold of capacity degradation can be in an inclusive range of, for example, 1% and 20% of the initial battery capacity 130.

Figure 4A:
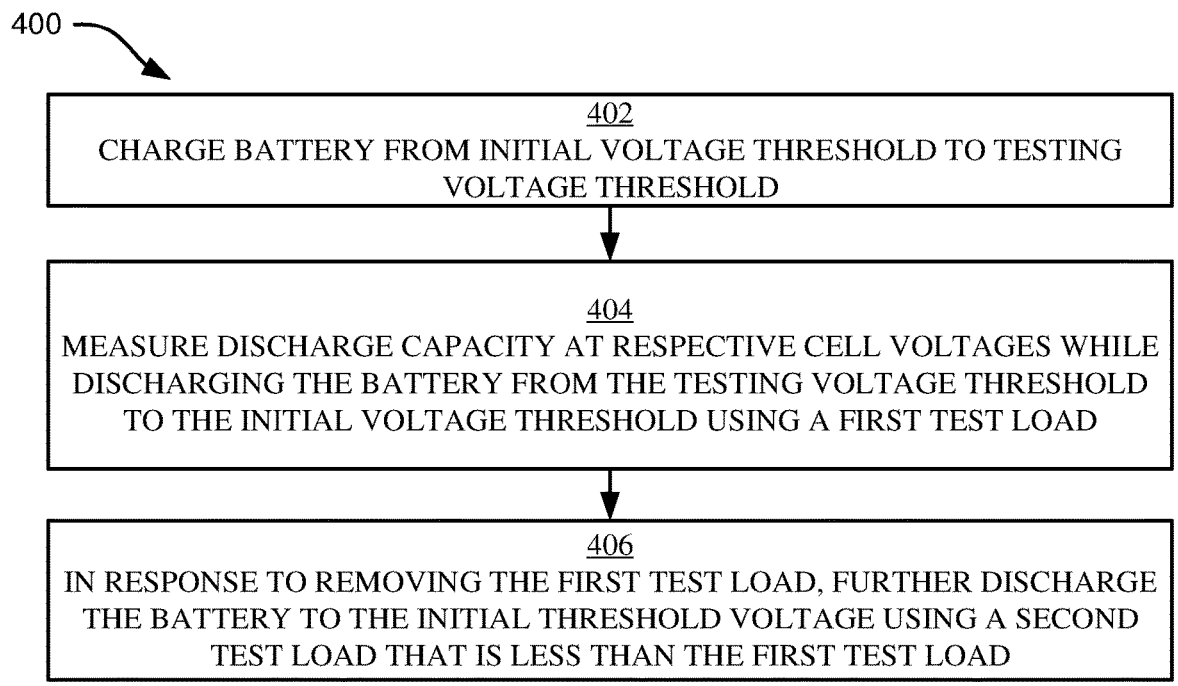
FIG. 4A illustrates a flowchart of an example method for testing a backup battery while it remains online, in accordance with some embodiments of the present disclosure.

Referring now to FIG. 4A, illustrated is a flowchart of an example method 400 for testing cells 106. In some embodiments, the method 400 is implemented by a backup battery system 102, a BMS 108, or a different configuration of hardware and/or software. In some embodiments, the method 400 is a sub-method of operation 206 of FIG. 2.

Operation 402 includes charging the cells 106 from an initial voltage threshold 132-1 to a testing voltage threshold (where the testing voltage threshold is greater than the initial voltage threshold 132-1 and less than a maximum voltage threshold for the cells 106).

Operation 404 includes measuring discharge capacity at respective voltage measurement points 114 while discharging the cells 106 from the testing voltage threshold to the initial voltage threshold 132-1 using a first test load (e.g., $P_1$). In some embodiments, operation 404 further includes removing the first test load after discharging the cells 106 back to the initial voltage threshold 132-1.

Operation 406 includes, in response to removing the first test load, further discharging the cells 106 to the initial voltage threshold 132-1 using a second test load (e.g., $P_2$), where the second test load is less than the first test load. As will be appreciated by one skilled in the art, removing the first test load will cause a rebound effect in the voltage of the cells 106. Thus, operation 406 can be used to negate the rebound effect of removing the first test load by further discharging the cells 106 using the second, smaller test load.

Figure 4B:
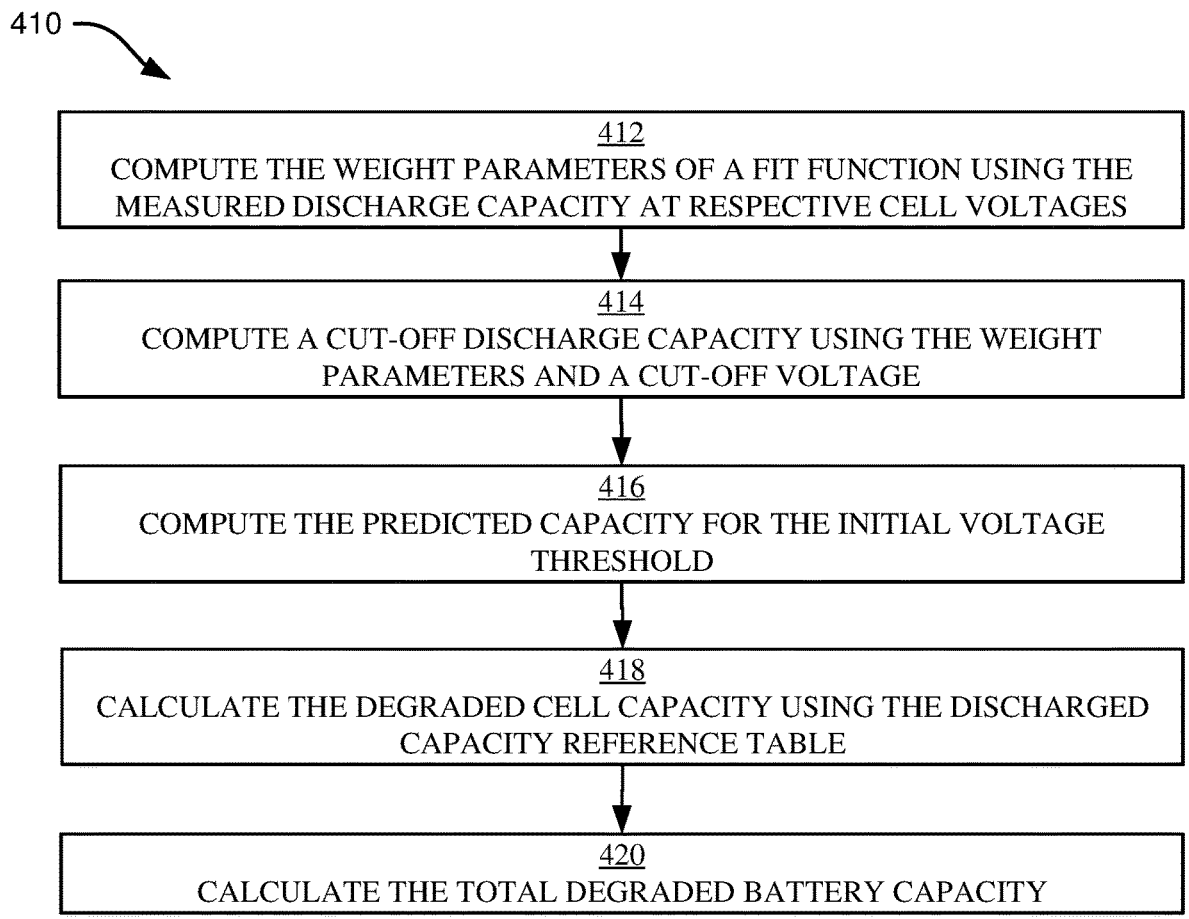
FIG. 4B illustrates a flowchart of an example method for calculating a degraded battery capacity, in accordance with some embodiments of the present disclosure.

Referring now to FIG. 4B, illustrated is an example method 410 for calculating a degraded battery capacity 134, in accordance with some embodiments of the present disclosure. In some embodiments, the method 410 is implemented by a backup battery system 102, a BMS 108, or a different configuration of hardware and/or software. In some embodiments, the method 410 occurs as a sub-method of operation 206 of FIG. 2. In some embodiments, the method 410 occurs after the method 400 of FIG. 4A.

Before discussing FIG. 4B in detail, a brief discussion of some of the mathematical concepts underlying aspects of the present disclosure may be beneficial. First, for a battery formed by p rows and q columns of cells 106, let C denote the discharge capacity of the battery starting from a fully-charged state, and let $c_j$ denote the discharge capacity of each column cell starting from a fully-charged state. Equation 1A calculates the discharge capacity of the battery:

$$C = \Sigma_{j=1}^{q} c_j \qquad \text{Equation 1A:}$$

Equation 1A can be simplified to Equation 1B for an approximately uniform battery environment:

$$C \cong q \cdot c \qquad \text{Equation 1B:}$$

Meanwhile, the total degraded capacity of the battery can be defined as $\Psi$, where $\psi_j$ can correspond to the degraded capacity of each column cell of the battery matrix. Thus, degraded battery capacity 134 for a given time, t, can be defined according to Equation 2A:

$$\Psi(t) = \Sigma_{j=1}^{q} \psi_j(t) \qquad \text{Equation 2A:}$$

Equation 2A can be simplified to Equation 2B for approximately similar aging rates for cells 106 operating in a uniform environment. Equation 2B can be used to denote the estimated degraded battery capacity 134 using degraded cell capacities.

$$\Psi(t) \cong q \cdot \psi_j(t) \qquad \text{Equation 2B:}$$

Similarly, battery voltage, V, can be calculated from various cell voltages, v, according to the number of rows, p, in a battery as shown in Equation 3A:

$$V = \Sigma_{j=1}^{p} v_j \qquad \text{Equation 3A:}$$

Equation 3A can be simplified to Equation 3B for uniform application environments:

$$V \cong p \cdot v \qquad \text{Equation 3B:}$$

A variety of chemical compositions and different structures of batteries can have different ageing effects over time. Cell floating life experiments can be useful for understanding battery characteristics. Typically, the experiments can be done with a higher storage temperature and fully charged (or near fully-charged) batteries for a given period. According to battery characterization test results, graphs interrelating cell voltages vs. discharge capacities can be established. In some embodiments, the discharge capacity can refer to the capacity that has been discharged by a cell 106 starting from a fully charged status and ending at a certain cell voltage (e.g., Closed Circuit Voltage (CCV)) by a certain discharge load (e.g., P). As above, in the situation where cell voltage is denoted by v and cell discharge capacity is denoted by c, a mathematical function can relate these terms according to Equation 4:

$$v = f(w_0, w_1, \ldots w_n; c) \qquad \text{Equation 4:}$$

In Equation 4, $w_n$ can refer to various weight parameters required by the function, $f$. Aspects of the present disclosure recognize that polynomial functions (e.g., polynomial fit function 122) can be good approximators of the cell voltage vs. discharge capacity graphs discussed above. A polynomial equation utilizing the weight parameters discussed above can be defined according to Equation 5:

$$v = \Sigma_{i=0}^{n} w_i c^i \qquad \text{Equation 5:}$$

In Equation 5, n can be the hyperparameter n 124 and can define the order of the polynomial equation. The larger the hyperparameter n 124, the more accurately the polynomial equation will approximate the cell voltage vs. discharge graph. Likewise, the larger the hyperparameter n 124, the more computationally intensive the polynomial equation calculation is. Therefore, a relatively lower hyperparameter n 124 that meets an acceptable goodness-of-fit is often selected. Goodness-of-fit can be defined by statistical measures, such as coefficient of determination (also known as $R^2$ or R-squared). In some embodiments, a hyperparameter of three (e.g., a third-order polynomial) often results in a $R^2$ value of above 0.98 for various cells aged various amounts of time (test results discussed hereinafter with respect to FIGS. 6, 7A-7B, and 8A-8B).

Using the above equations, a voltage can be calculated at any predefined measurement point, k, according to Equation 6:

$$V_k = p \cdot \sum_{i=0}^{n} w_i \cdot \left(\frac{C_k}{q}\right)^i \qquad \text{Equation 6:}$$

Returning to FIG. 4, and in light of the aforementioned mathematical concepts, operation 412 includes computing weight parameters of the polynomial fit function 122 using the voltage/discharge capacity data 116. In some embodiments, operation 412 uses Equation 7. Equation 7 can be based on Equation 6 for a set of voltage measurement points 114, k, the set of voltage measurement points 114 ranging from 0 to n.

$$V_k = p \cdot (\vec{C_k})^T \cdot \vec{W}, \text{ where } \vec{W} = \begin{pmatrix} w_n \\ \cdots \\ w_0 \end{pmatrix} \text{ and } \vec{C_k} = \begin{pmatrix} (C_k/q)^n \\ \cdots \\ 1 \end{pmatrix} \qquad \text{Equation 7:}$$

Operation 412 can utilize the voltage/discharge capacity data 116 (e.g., data points of ($C_k$, $V_k$) for a set of voltage measurement points 114, k). The data points ($C_k$, $V_k$) can be used with Equation 7 to determine the weight parameter vector, $\vec{W}$ (e.g., determine all weights $w_i$).

Operation 414 includes computing a cut-off discharge capacity using the weight parameters of operation 412 and a cut-off voltage. In other words, after determining all weights $w_i$, aspects of the present disclosure can proceed to calculate a discharge capacity at the cut-off voltage of a single cell, where the cut-off discharge capacity can be represented by $c_{co}$ and the cut-off voltage can be represented by $v_{co}$. Cut-off discharge capacity, $c_{co}$, (e.g., the discharge capacity from a pre-defined charge end-point to the cut-off voltage) can be calculated using an inverse function with cut-off voltage, $v_{co}$, and one or more weight parameters, $w_i$, as inputs as shown in Equation 8. In some embodiments, Equation 8 utilizes a successive approximation approach to solve for $c_{co}$ with an acceptable error.

$$c_{co} = f^{-1}(w_i; v_{co}) \qquad \text{Equation 8:}$$

Operation 416 includes computing a predicted capacity for the initial voltage threshold 132-1 based on the polynomial fit function 122. Operation 416 can include inputting the initial voltage threshold 132-1 into Equation 9 (for a true estimate) or Equation 11 (for an offset estimate).

A more detailed discussion of operation 416 will now be presented. In light of the above, for the initial voltage threshold 132-1, denoted as $v_0$, the predicted capacity, $\hat{c}$, can be calculated according to Equation 9 by subtracting the discharge capacity at the end of the measurement cycle, $c_1$, (e.g., at approximately the initial threshold voltage 132-1 under the first test load) from the cut-off discharge capacity, $c_{co}$, and further subtracting the discharge capacity measured using the second test load, c', from the cut-off discharge capacity, $c_{co}$:

$$\hat{c} = c_{co} - c_1 - c' \qquad \text{Equation 9:}$$

As previously discussed, to generate conservative estimates, an offset parameter b 126 can be utilized to shift voltage calculations and/or capacity calculations. For example, Equation 10 shows a shifted voltage calculation where $v_{shift}$ will be less than or equal to $v_{actual}$:

$$v_{shift} = \Sigma_{i=0}^n w_i c^i - b \qquad \text{Equation 10:}$$

Accordingly, aspects of the present disclosure can calculate a shifted discharge capacity, $\widehat{c_b}$, according to Equation 11, where $c'_{co}$ is the cutoff discharge capacity accounting for the offset parameter b 126:

$$\widehat{c_b} = c'_{co} - c_1 - c' \qquad \text{Equation 11:}$$

Operation 418 includes calculating the degraded cell capacity. The degraded capacity, $\psi$, can be calculated according to Equation 12, where the degraded cell capacity is greater than or equal to the actual degraded capacity. In some embodiments, co is retrieved from discharge capacity reference table 110:

$$\psi = c_0 - \widehat{c_b} \geq c_0 - \hat{c} \qquad \text{Equation 12:}$$

Operation 420 includes calculating the total degraded battery capacity 134, $\Psi$. In some embodiments, the total degraded battery capacity 134 governs how much the cells 106 are charged in order to maintain an appropriate battery SoC 128. Total degraded battery capacity 134 can be calculated according to Equation 13:

$$\Psi = q \cdot \psi \qquad \text{Equation 13:}$$

In some embodiments of the present disclosure, the BMS 108 can charge the cells 106 by $\Psi$. In the event that doing so causes the battery voltage to exceed a maximum allowable voltage, then the BMS 108 can stop charging the cells 106 and transmit an alert to a user interface communicatively coupled to the BMS 108 that requests a service call on the backup battery system 102 (e.g., replacement of cells 106, throttling of usage, etc.).

Figure 5:
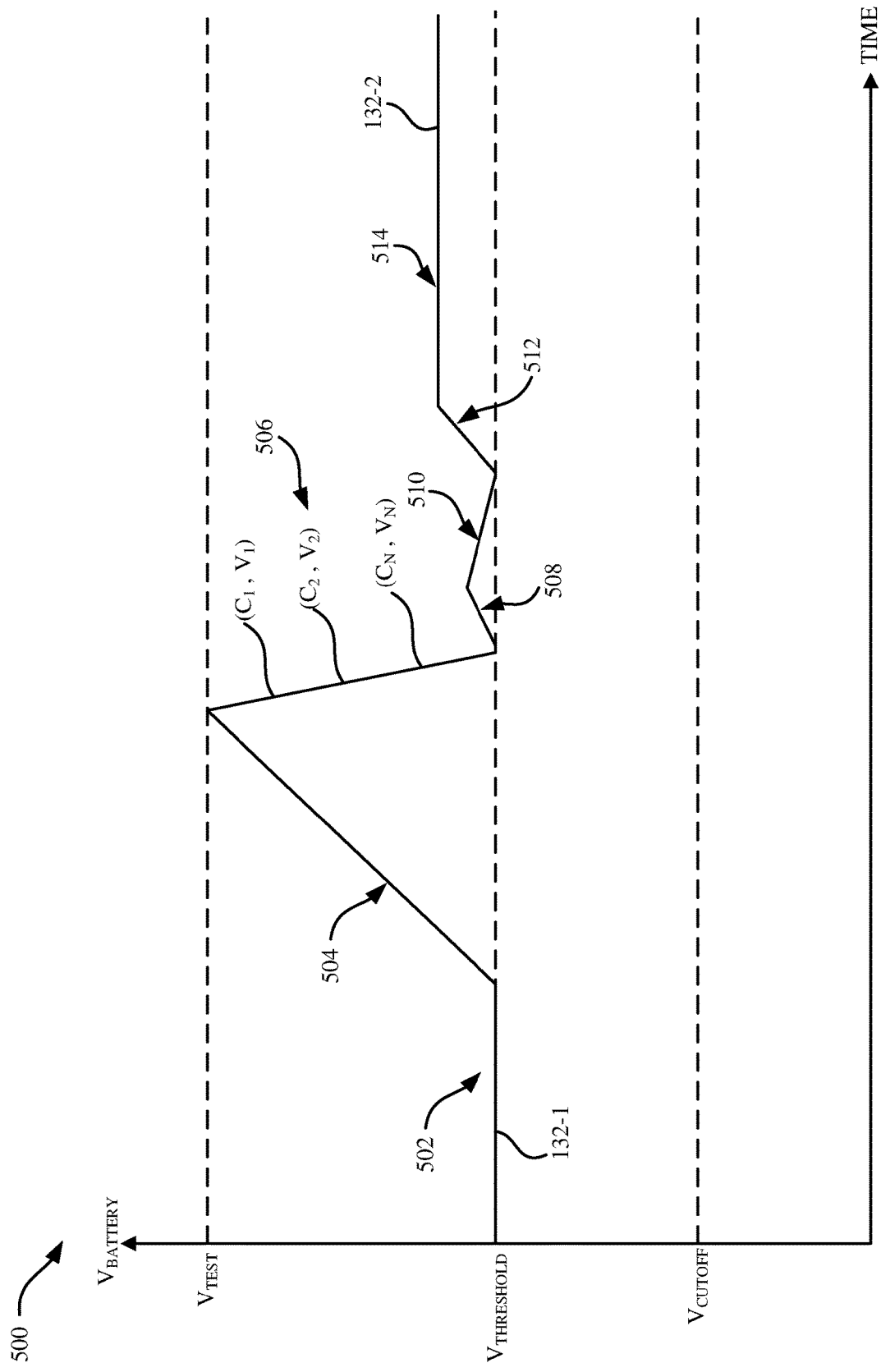
FIG. 5 illustrates a diagram of a voltage chart of a battery undergoing testing and with a corrected state of charge, in accordance with some embodiments of the present disclosure.

Referring now to FIG. 5, illustrated is an example voltage diagram 500 of one or more cells 106 undergoing testing, in accordance with embodiments of the present disclosure. In some embodiments, the testing shown in FIG. 5 can be implemented on one or more cells 106 by a BMS 108.

The voltage diagram 500 includes cell voltage (or battery voltage) along the y-axis and time along the x-axis. During a first time interval 502, the battery is maintained at an initial voltage threshold 132-1. Testing is initiated at time interval 504, and the cells 106 are charged from the initial voltage threshold 132-1 to a test voltage threshold, where the test voltage threshold is greater than the initial voltage threshold 132-1 and less than a maximum voltage threshold for the cell 106. In some embodiments, the time interval 504 is initiated in response to expiration of a CDDT 118. During time interval 506, the discharge measurement utility 112 collects data in the form of discharge capacity at certain voltages (e.g., ($C_k$, $V_k$) data) at one or more voltage measurement points 114 while discharging the cell 106 from the test voltage threshold back to the initial voltage threshold 132-1 using a first test load (e.g., $P_1$). At time interval 508, the voltage of cells 106 rebounds after the first test load is removed. At time interval 510, a second test load (e.g., $P_2$) is applied to return the voltage of cell 106 to the initial voltage threshold 132-1. The second test load can be a lighter load than the first test load. At time interval 512, the cells 106 are charged to an updated voltage threshold 132-2, and at time interval 514, the updated voltage threshold 132-2 is maintained.

Figure 6:
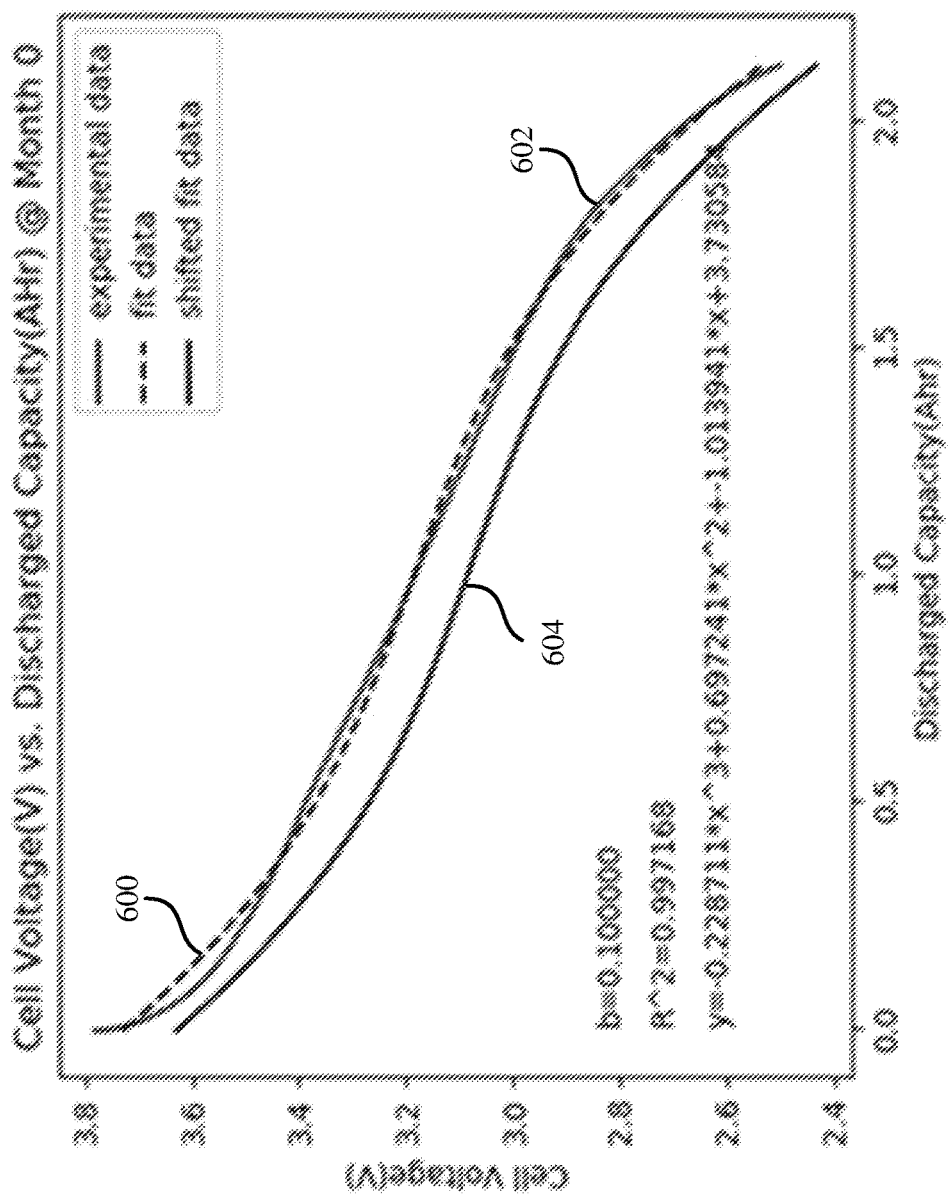
FIG. 6 illustrates a diagram of an example cell voltage vs. discharge capacity graph at 0 months, in accordance with some embodiments of the present disclosure.

Referring now to FIG. 6, illustrated is a first voltage vs. discharge capacity graph illustrating experimental results of aspects of the present disclosure. In the case of FIG. 6, the experimental data is gathered from a new battery (e.g., aged 0 months). As shown in FIG. 6, the fit data 600 (e.g., the polynomial fit function 122 using a hyperparameter n 124 of 3) closely approximates the experimental data 602 (e.g., the voltage/discharge capacity data 116) as quantified by an $R^2$ value of greater than 0.99. Further, the shifted fit data 604 (e.g., polynomial fit function 122 shifted according to offset parameter b 126) underestimates discharge capacity for any given voltage, or underestimates voltage for any given discharge capacity. In FIG. 6, the offset parameter b 126 is 0.1.

Figure 7A:
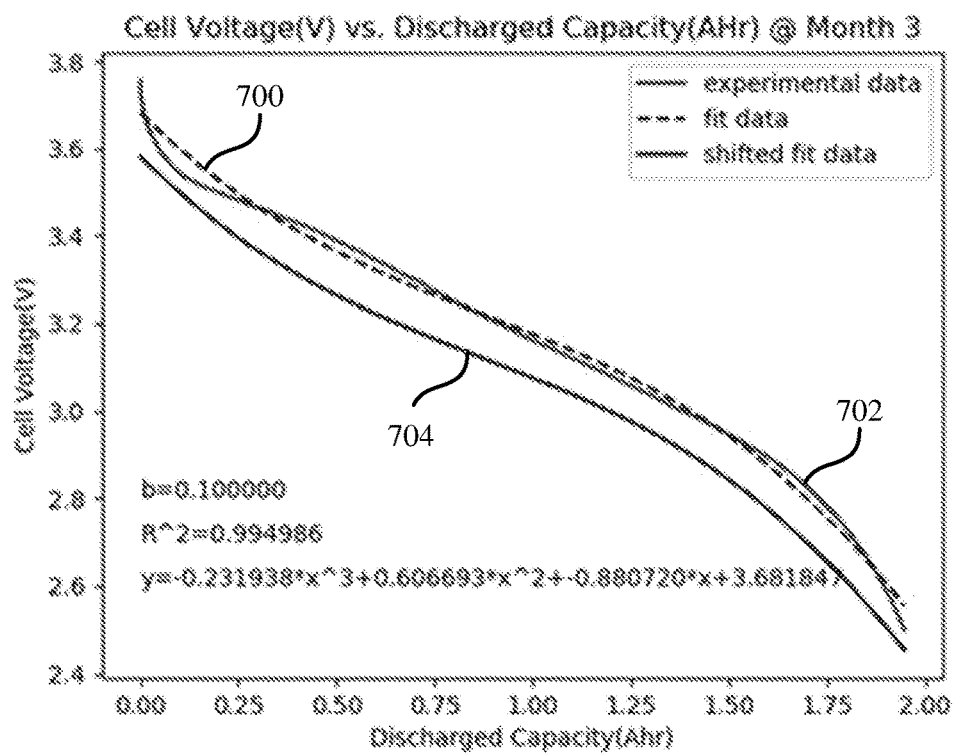
FIG. 7A illustrates a diagram of an example cell voltage vs. discharge capacity graph at 3 months, in accordance with some embodiments of the present disclosure.
Figure 7B:
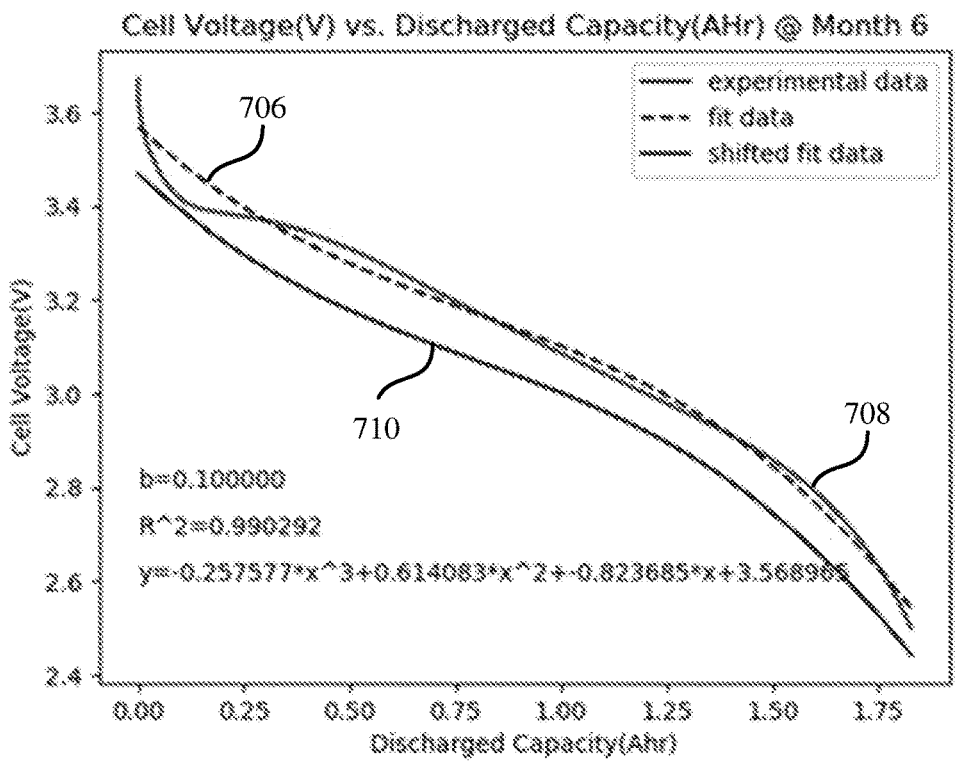
FIG. 7B illustrates a diagram of an example cell voltage vs. discharge capacity graph at 6 months, in accordance with some embodiments of the present disclosure.
Figure 8A:
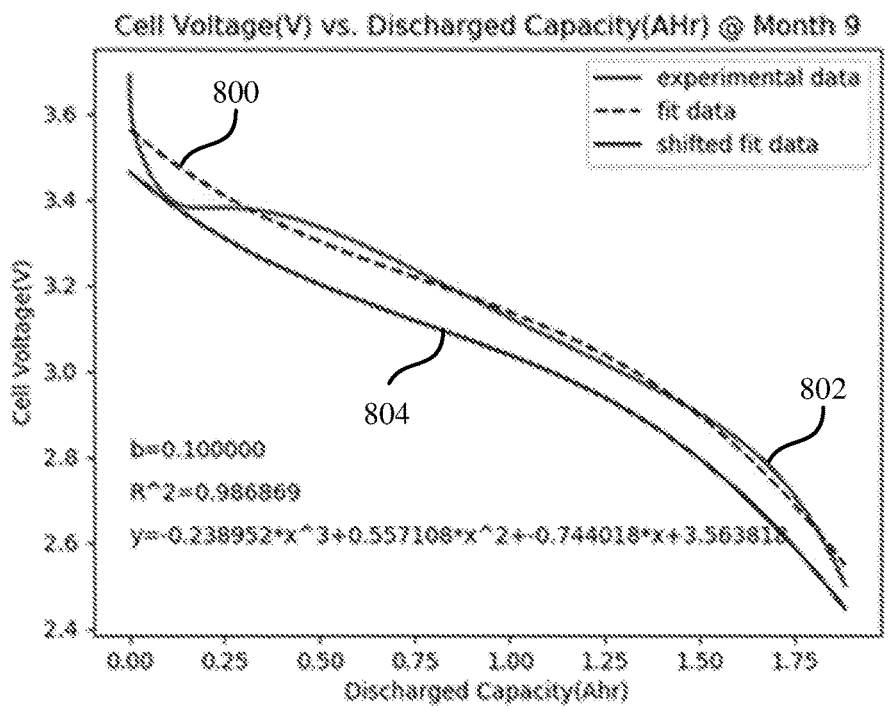
FIG. 8A illustrates a diagram of an example cell voltage vs. discharge capacity graph at 9 months, in accordance with some embodiments of the present disclosure.
Figure 8B:
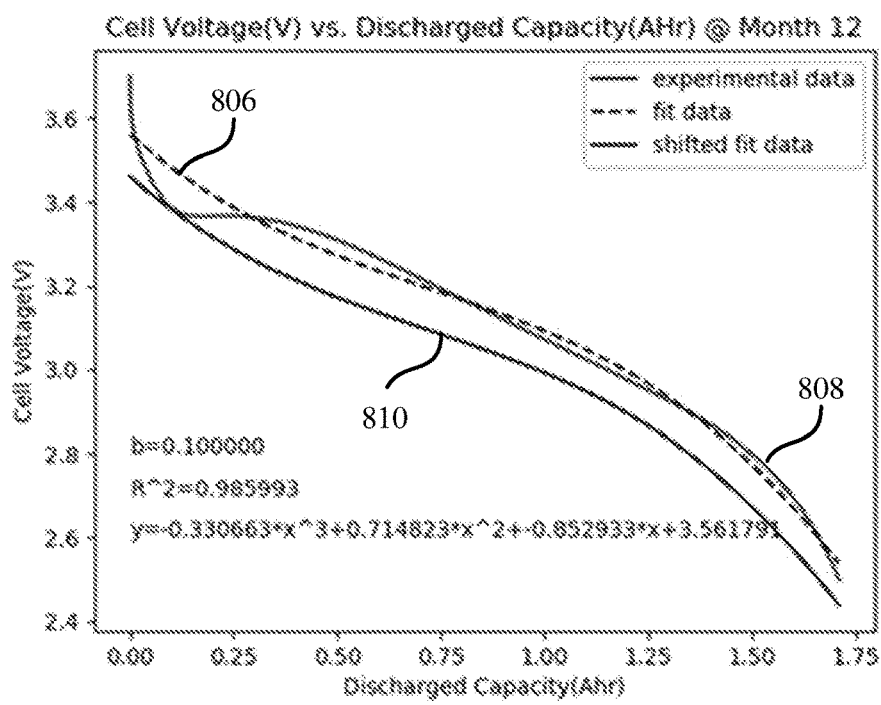
FIG. 8B illustrates a diagram of an example cell voltage vs. discharge capacity graph at 12 months, in accordance with some embodiments of the present disclosure.

Referring now to FIGS. 7A-7B and 8A-8B, illustrated are second, third, fourth, and fifth voltage vs. discharge capacity graphs illustrating experimental results of aspects of the present disclosure. FIG. 7A illustrates experimental results for a battery aged to 3 months, FIG. 7B illustrates experimental results for a battery aged to 6 months, FIG. 8A illustrates experimental results for a battery aged to 9 months, and FIG. 8B illustrates experimental results for a battery aged to 12 months. As with FIG. 6, FIGS. 7A-7B and 8A-8B illustrate that the fit data 700, 706, 800, and 806 (e.g., polynomial fit function 122 using a hyperparameter n 124 of 3) closely approximates the experimental data 702, 708, 802, and 808 (as shown by $R^2$ values above 0.99 in each of FIGS. 7A and 7B and above 0.98 in each of FIGS. 8A and 8B). Further, the shifted fit data 704, 710, 804, and 810 (e.g., polynomial fit function 122 shifted according to offset parameter b 126) equals or underestimates discharge capacity for any given voltage, or equals or underestimates voltage for any given discharge capacity. As with FIG. 6, the offset parameter b 126 is 0.1 in FIGS. 7A-7B and 8A-8B.

Figure 9:
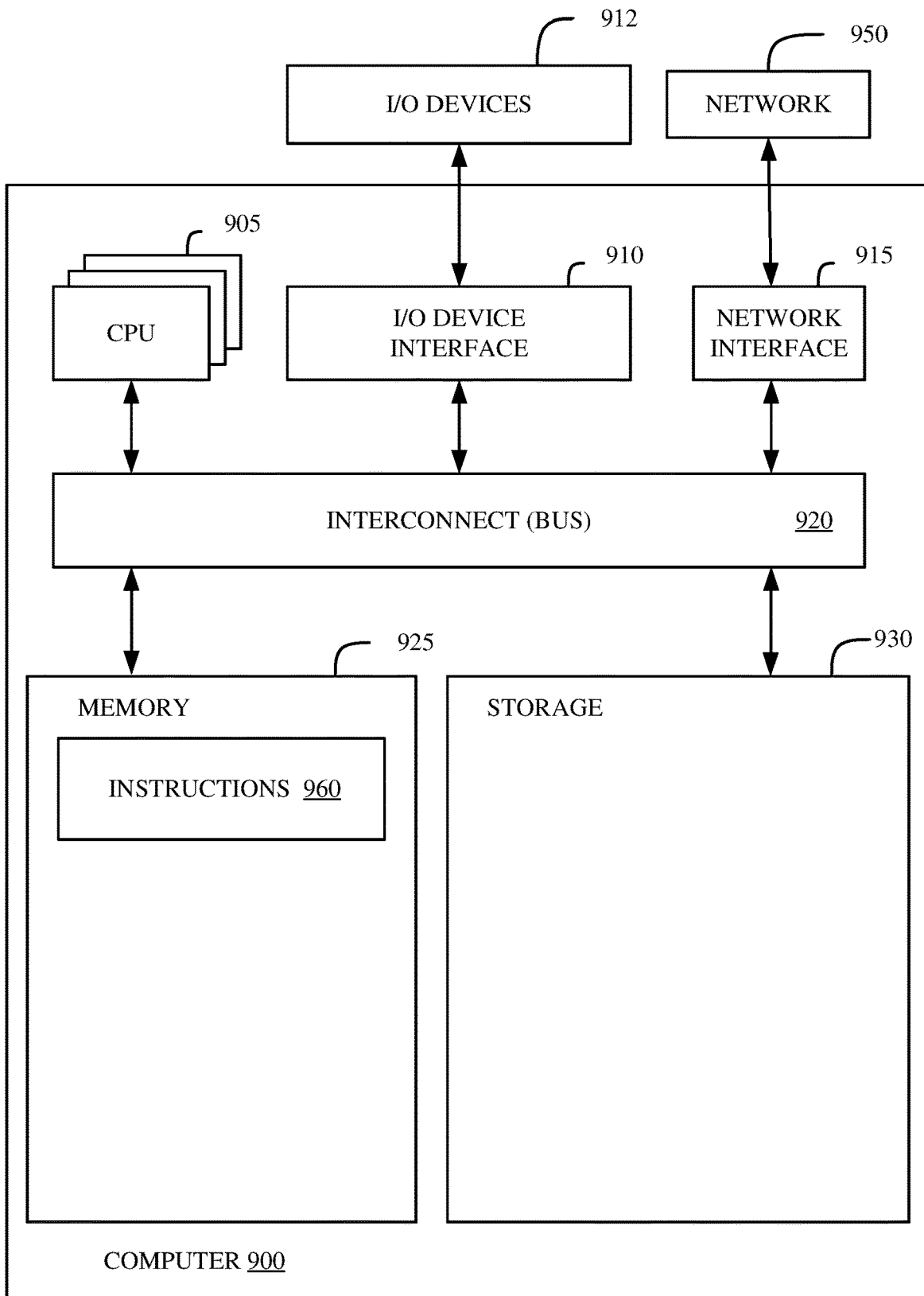
FIG. 9 illustrates a block diagram of an example computer, in accordance with some embodiments of the present disclosure.

FIG. 9 illustrates a block diagram of an example computer 900 in accordance with some embodiments of the present disclosure. In various embodiments, computer 900 can perform the methods described in FIGS. 2-4 and/or implement the functionality discussed in FIG. 1. In some embodiments, computer 900 receives instructions related to the aforementioned methods and functionalities by downloading processor-executable instructions from a remote data processing system via network 950. In other embodiments, computer 900 provides instructions for the aforementioned methods and/or functionalities to a client machine such that the client machine executes the method, or a portion of the method, based on the instructions provided by computer 900. In some embodiments, the computer 900 is incorporated into one or more of the battery backup system 102 (e.g., in BMS 108) and/or system 104.

Computer 900 includes memory 925, storage 930, interconnect 920 (e.g., BUS), one or more CPUs 905 (also referred to as processors herein), I/O device interface 910, I/O devices 912, and network interface 915.

Each CPU 905 retrieves and executes programming instructions stored in memory 925 or storage 930. Interconnect 920 is used to move data, such as programming instructions, between the CPUs 905, I/O device interface 910, storage 930, network interface 915, and memory 925. Interconnect 920 can be implemented using one or more busses. CPUs 905 can be a single CPU, multiple CPUs, or a single CPU having multiple processing cores in various embodiments. In some embodiments, CPU 905 can be a digital signal processor (DSP). In some embodiments, CPU 905 includes one or more 3D integrated circuits (3DICs) (e.g., 3D wafer-level packaging (3DWLP), 3D interposer based integration, 3D stacked ICs (3D-SICs), monolithic 3D ICs, 3D heterogeneous integration, 3D system in package (3DSiP), and/or package on package (PoP) CPU configurations). Memory 925 is generally included to be representative of a random-access memory (e.g., static random-access memory (SRAM), dynamic random access memory (DRAM), or Flash). Storage 930 is generally included to be representative of a non-volatile memory, such as a hard disk drive, solid state device (SSD), removable memory cards, optical storage, or flash memory devices. In an alternative embodiment, storage 930 can be replaced by storage area-network (SAN) devices, the cloud, or other devices connected to computer 900 via I/O device interface 910 or network 950 via network interface 915.

In some embodiments, memory 925 stores instructions 960. However, in various embodiments, instructions 960 are stored partially in memory 925 and partially in storage 930, or they are stored entirely in memory 925 or entirely in storage 930, or they are accessed over network 950 via network interface 915.

Instructions 960 can be processor-executable instructions for performing any portion of, or all of, any of the methods of FIGS. 2-4 and/or implementing any of the functionality discussed in FIG. 1.

In various embodiments, I/O devices 912 include an interface capable of presenting information and receiving input. For example, I/O devices 912 can present information to a user interacting with computer 900 and receive input from the user.

Computer 900 is connected to network 950 via network interface 915. Network 950 can comprise a physical, wireless, cellular, or different network.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 10:
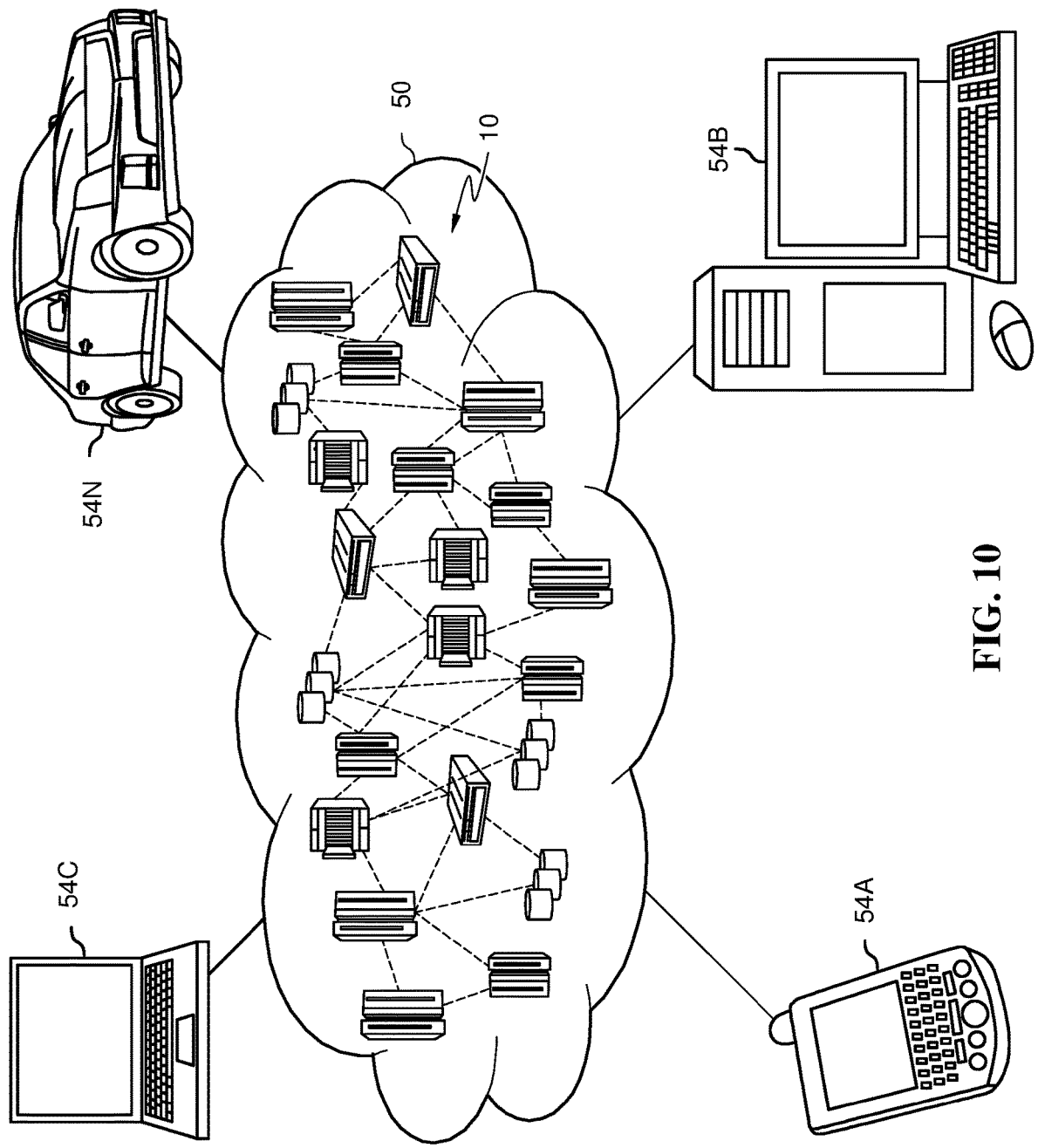
FIG. 10 depicts a cloud computing environment, in accordance with some embodiments of the present disclosure.

Referring now to FIG. 10, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 10 are intended to be illustrative only and that computing nodes 10 and cloud computing environment 50 can communicate with any type of computerized device over any type of network and/or network addressable connection (e.g., using a web browser).

Figure 11:
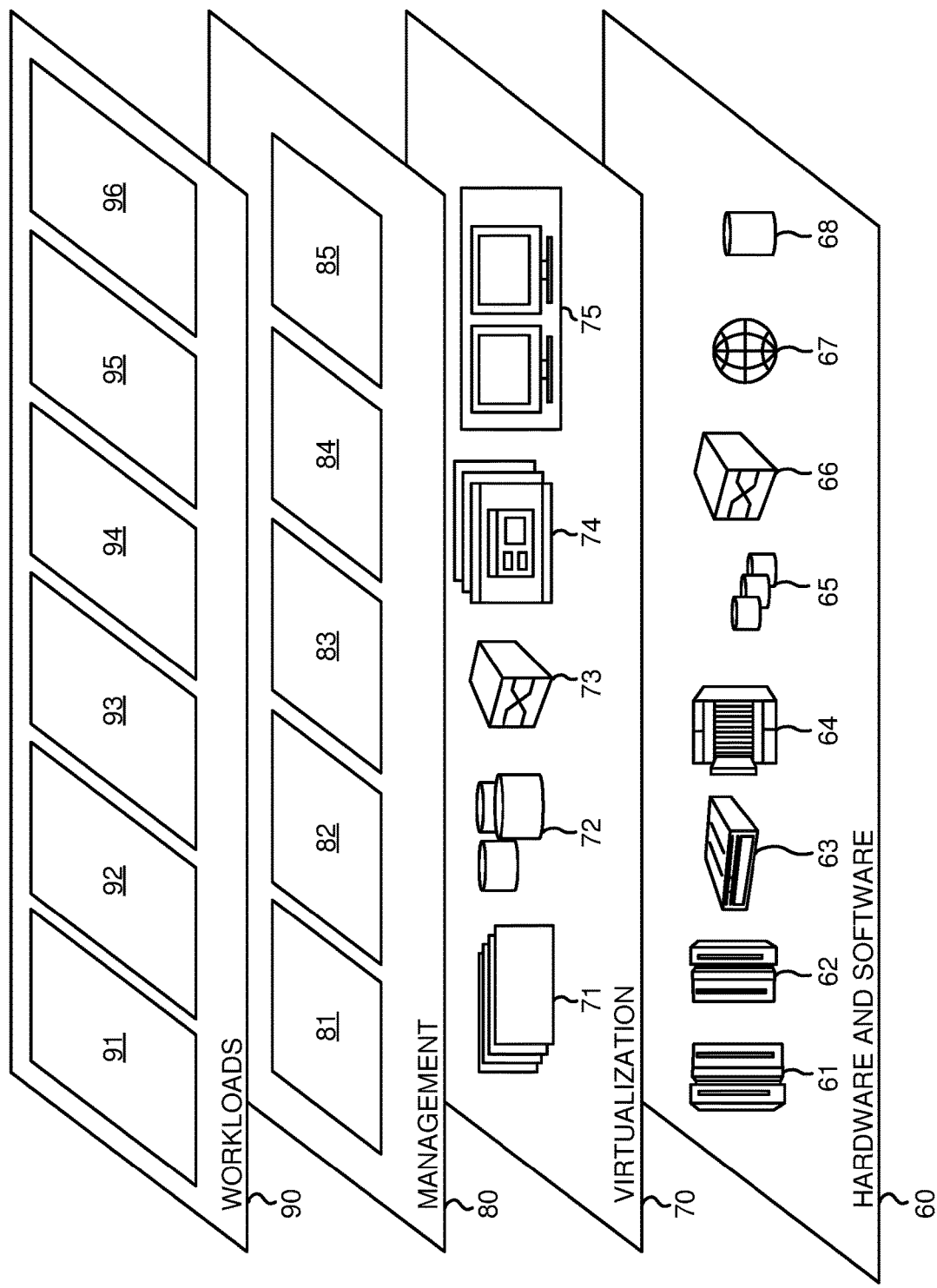
FIG. 11 depicts abstraction model layers, in accordance with some embodiments of the present disclosure.

Referring now to FIG. 11, a set of functional abstraction layers provided by cloud computing environment 50 (FIG. 10) is shown. It should be understood in advance that the components, layers, and functions shown in FIG. 11 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and battery management 96.

Embodiments of the present invention can be a system, a method, and/or a computer program product at any possible technical detail level of integration. The computer program product can include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or subset of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While it is understood that the process software (e.g., any of the instructions stored in instructions 960 of FIG. 9 and/or any software configured to perform any subset of the methods described with respect to FIGS. 2-4 and/or any of the functionality discussed in FIG. 1) can be deployed by manually loading it directly in the client, server, and proxy computers via loading a storage medium such as a CD, DVD, etc., the process software can also be automatically or semi-automatically deployed into a computer system by sending the process software to a central server or a group of central servers. The process software is then downloaded into the client computers that will execute the process software. Alternatively, the process software is sent directly to the client system via e-mail. The process software is then either detached to a directory or loaded into a directory by executing a set of program instructions that detaches the process software into a directory. Another alternative is to send the process software directly to a directory on the client computer hard drive. When there are proxy servers, the process will select the proxy server code, determine on which computers to place the proxy servers' code, transmit the proxy server code, and then install the proxy server code on the proxy computer. The process software will be transmitted to the proxy server, and then it will be stored on the proxy server.

Embodiments of the present invention can also be delivered as part of a service engagement with a client corporation, nonprofit organization, government entity, internal organizational structure, or the like. These embodiments can include configuring a computer system to perform, and deploying software, hardware, and web services that implement, some or all of the methods described herein. These embodiments can also include analyzing the client's operations, creating recommendations responsive to the analysis, building systems that implement subsets of the recommendations, integrating the systems into existing processes and infrastructure, metering use of the systems, allocating expenses to users of the systems, and billing, invoicing (e.g., generating an invoice), or otherwise receiving payment for use of the systems.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments can be practiced. These embodiments were described in sufficient detail to enable those skilled in the art to practice the embodiments, but other embodiments can be used and logical, mechanical, electrical, and other changes can be made without departing from the scope of the various embodiments. In the previous description, numerous specific details were set forth to provide a thorough understanding the various embodiments. But the various embodiments can be practiced without these specific details. In other instances, well-known circuits, structures, and techniques have not been shown in detail in order not to obscure embodiments.

Different instances of the word "embodiment" as used within this specification do not necessarily refer to the same embodiment, but they can. Any data and data structures illustrated or described herein are examples only, and in other embodiments, different amounts of data, types of data, fields, numbers and types of fields, field names, numbers and types of rows, records, entries, or organizations of data can be used. In addition, any data can be combined with logic, so that a separate data structure may not be necessary. The previous detailed description is, therefore, not to be taken in a limiting sense.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present disclosure has been described in terms of specific embodiments, it is anticipated that alterations and modification thereof will become apparent to the skilled in the art. Therefore, it is intended that the following claims be interpreted as covering all such alterations and modifications as fall within the true spirit and scope of the disclosure.

Any advantages discussed in the present disclosure are example advantages, and embodiments of the present disclosure can exist that realize all, some, or none of any of the discussed advantages while remaining within the spirit and scope of the present disclosure.

A first example of the present disclosure relates to a computer-implemented method comprising initializing a BMS 108 associated with a battery, the BMS 108 storing a discharge capacity reference table 110 indicating discharged capacities at predetermined voltages and predetermined loads for the battery in a new state. The method further comprises calculating a degraded battery capacity 134 by charging the battery from a first voltage threshold 132-1 to a test voltage threshold, discharging the battery from the test voltage threshold to the first voltage threshold 132-1, measuring discharge capacity at predetermined voltage measurement points 114 while discharging the battery from the test voltage threshold to the first voltage threshold 132-1, generating a polynomial fit function 122 for discharge capacity as a function of voltage for the battery based on the measuring, and estimating the degraded battery capacity 134 based on a difference between a reference discharge capacity for the first voltage threshold 132-1 according to the discharge capacity reference table 110 and a predicted discharge capacity based on inputting the first voltage threshold 132-1 to the polynomial fit function 122. The method further comprises charging the battery based on the degraded battery capacity 134 to cause the battery to maintain an updated voltage threshold 132-2.

A second example including the limitations of the first example further includes wherein initializing the BMS 108 further includes storing a hyperparameter n 124 in the BMS 108, and wherein the polynomial fit function 122 has an order according to the hyperparameter n 124.

A third example including the limitations of the second example further includes wherein the hyperparameter n 124 is selected from a group consisting of: two, three, and four.

A fourth example including the limitations of one or more of the first through third examples further includes, wherein initializing the battery management system further includes storing an offset parameter b 126 in the BMS 108, and wherein the polynomial fit function 122 is shifted by the offset parameter b 126.

A fifth example including the limitations of the fourth example further includes, wherein the offset parameter b 126 is between 0.05 and 0.50.

A sixth example including the limitations of one or more of the first through fifth examples further includes, wherein the discharging the battery from the test voltage threshold to the first voltage threshold 132-1 is performed with a first test load, and wherein calculating the degraded battery capacity 134 further includes, in response to discharging the battery from the test voltage threshold to the first voltage threshold 132-1, removing the first test load; and, in response to removing the first test load, applying a second test load to discharge the battery from a rebound voltage to the first voltage threshold 132-1, wherein the second test load is less than the first test load.

A seventh example including the limitations of one or more of the first through sixth examples further includes, the initializing the BMS 108 further includes initiating a capacity degradation detection timer 118, and wherein calculating the degraded battery capacity 134 occurs in response to expiration of capacity degradation detection timer 118.

An eighth example including the limitations of the seventh example further includes, wherein the capacity degradation detection timer 118 expires at each interval of time, and wherein the interval of time is in a range between one week and eight weeks.

A ninth example including the limitations of one or more of the first through eighth examples further includes, wherein the battery is a backup battery performing standby backup for a system application powered by mains power.

A tenth example including the limitations of the ninth example further includes (1) detecting the system application lost the mains power, (2) pausing the calculating of the degraded battery capacity 134 while the system application does not have the mains power, (3) powering the system application using the backup battery system 102, (4) detecting the mains power is restored to the system application, (5) transferring powering of the system application from the backup battery system 102 to the mains power, and (6) resuming the calculating the degraded battery capacity 134.

An eleventh example including the limitations of the ninth example further includes, wherein the system application is selected from a group consisting of: a server, a router, and a home appliance.

A twelfth example including the limitations of one or more of the first through eleventh examples further includes, wherein initializing the BMS 108 further includes loading a degraded battery capacity threshold into the BMS 108, and wherein charging the battery based on the degraded battery capacity 134 occurs in response to determining that the degraded battery capacity 134 exceeds the degraded battery capacity threshold.

A thirteenth example including limitations of one or more of the first through twelfth examples further includes, wherein while calculating the degraded battery capacity, a battery voltage of the battery is greater than or equal to the first voltage threshold.

A fourteenth example including the limitations of one or more of the first through thirteenth examples further includes, wherein charging the battery by the degraded battery capacity 134 further comprises (1) detecting that the charging causes the battery to exceed a maximum voltage threshold, (2) stopping the charging in response to detecting that the charging causes the battery to exceed the maximum voltage threshold, and (3) transmitting an alert to a user interface associated with the BMS 108 indicating that the battery requires servicing.

A fifteenth example including the limitations of one or more of the first through fourteenth examples further includes, wherein the polynomial fit function 122 is associated with an R-squared value above a goodness-of-fit threshold.

A sixteenth example including the limitations of the fifteenth example further includes, wherein the goodness-of-fit threshold is between 0.90 and 0.99.

A seventeenth example including the limitations of one or more of the first through sixteenth examples further includes, wherein the method is implemented by the BMS 108 according to program instructions downloaded to the BMS 108 from a remote data processing system.

An eighteenth example including the limitations of one or more of the first through seventeenth examples further includes, wherein the method is implemented by a remote data processing system interfacing with the battery management system via a network.

What is claimed is:

1. A computer-implemented method comprising:
    initializing a battery management system associated with a battery, the battery management system storing a discharge capacity reference table indicating discharged capacities at predetermined voltages and predetermined loads for the battery in a new state;
    calculating a degraded battery capacity by:
        charging the battery from a first voltage threshold to a test voltage threshold;
        discharging the battery from the test voltage threshold to the first voltage threshold;
        measuring discharge capacity at predetermined voltage measurement points during the discharging of the battery from the test voltage threshold to the first voltage threshold;
        generating a polynomial fit function for discharge capacity as a function of voltage for the battery based on the measuring; and
        estimating the degraded battery capacity based on a difference between a reference discharge capacity for the first voltage threshold according to the discharge capacity reference table and a predicted discharge capacity based on inputting the first voltage threshold to the polynomial fit function; and
    charging the battery based on the degraded battery capacity to cause the battery to maintain an updated voltage threshold.

2. The method of claim 1, wherein initializing the battery management system further includes storing a hyperparameter n in the battery management system, and wherein the polynomial fit function has an order according to the hyperparameter n.

3. The method of claim 2, wherein the hyperparameter n is selected from a group consisting of: two, three, and four.

4. The method of claim 1, wherein initializing the battery management system further includes storing an offset parameter b in the battery management system, and wherein the polynomial fit function is shifted by the offset parameter b.

5. The method of claim 4, wherein the offset parameter b is between 0.05 and 0.50.

6. The method of claim 1, wherein the discharging the battery from the test voltage threshold to the first voltage threshold is performed with a first test load, and wherein calculating the degraded battery capacity further includes:
    in response to discharging the battery from the test voltage threshold to the first voltage threshold, removing the first test load; and
    in response to removing the first test load, applying a second test load to discharge the battery from a rebound voltage to the first voltage threshold, wherein the second test load is less than the first test load.

7. The method of claim 1, initializing the battery management system further includes initiating a capacity degradation detection timer, and wherein calculating the degraded battery capacity occurs in response to expiration of the capacity degradation detection timer.

8. The method of claim 7, wherein the capacity degradation detection timer expires at each interval of time, wherein the interval of time is in a range between one week and eight weeks.

9. The method of claim 1, wherein the battery is a backup battery performing standby backup for a system application powered by a mains power.

10. The method of claim 9, the method further comprising:
    detecting the system application lost the mains power;
    pausing the calculating of the degraded battery capacity while the system application does not have the mains power;
    powering the system application using the backup battery;
    detecting the mains power is restored to the system application;
    transferring powering of the system application from the backup battery to the mains power; and
    resuming the calculating the degraded battery capacity.

11. The method of claim 9, wherein the system application is selected from a group consisting of: a server, a router, and a home appliance.

12. The method of claim 1, wherein initializing the battery management system further includes loading a degraded battery capacity threshold into the battery management system, and wherein charging the battery based on the degraded battery capacity occurs in response to determining that the degraded battery capacity exceeds the degraded battery capacity threshold.

13. The method of claim 1, wherein while calculating the degraded battery capacity, a battery voltage of the battery is greater than or equal to the first voltage threshold.

14. The method of claim 1, wherein charging the battery by the degraded battery capacity further comprises:
    detecting that the charging causes the battery to exceed a maximum voltage threshold;
    stopping the charging in response to detecting that the charging causes the battery to exceed the maximum voltage threshold; and
    transmitting an alert to a user interface associated with the battery management system indicating that the battery requires servicing.

15. The method of claim 1, wherein the polynomial fit function is associated with an R-squared value at or above a goodness-of-fit threshold.

16. The method of claim 15, wherein the goodness-of-fit threshold is between 0.90 and 0.99.

17. The method of claim 1, wherein the method is implemented by the battery management system according to program instructions downloaded to the battery management system from a remote data processing system.

18. The method of claim 1, wherein the method is implemented by a remote data processing system interfacing with the battery management system via a network.

19. A computer program product comprising a computer readable storage medium having program instructions embodied therewith, the program instructions executable by a processor to cause the processor to perform a method comprising:
- initializing a battery management system associated with a battery, the battery management system storing a discharge capacity reference table indicating discharged capacities at predetermined voltages and predetermined loads for the battery in a new state;
- calculating a degraded battery capacity by:
  - charging the battery from a first voltage threshold to a test voltage threshold;
  - discharging the battery from the test voltage threshold to the first voltage threshold;
  - measuring discharge capacity at predetermined voltage measurement points during the discharging of the battery from the test voltage threshold to the first voltage threshold;
  - generating a polynomial fit function for discharge capacity as a function of voltage for the battery based on the measuring; and
  - estimating the degraded battery capacity based on a difference between a reference discharge capacity for the first voltage threshold according to the discharge capacity reference table and a predicted discharge capacity based on inputting the first voltage threshold to the polynomial fit function; and
- charging the battery based on the degraded battery capacity to cause the battery to maintain an updated voltage threshold.

20. A system comprising:
- a processor; and
- a computer-readable storage medium storing program instructions which, when executed by the processor, are configured to cause the processor to perform a method comprising:
- initializing a battery management system associated with a battery, the battery management system storing a discharge capacity reference table indicating discharged capacities at predetermined voltages and predetermined loads for the battery in a new state;
- calculating a degraded battery capacity by:
  - charging the battery from a first voltage threshold to a test voltage threshold;
  - discharging the battery from the test voltage threshold to the first voltage threshold;
  - measuring discharge capacity at predetermined voltage measurement points during the discharging of the battery from the test voltage threshold to the first voltage threshold;
  - generating a polynomial fit function for discharge capacity as a function of voltage for the battery based on the measuring; and
  - estimating the degraded battery capacity based on a difference between a reference discharge capacity for the first voltage threshold according to the discharge capacity reference table and a predicted discharge capacity based on inputting the first voltage threshold to the polynomial fit function; and
- charging the battery based on the degraded battery capacity to cause the battery to maintain an updated voltage threshold.

* * * * *